(12) United States Patent
Sakai et al.

(10) Patent No.: US 6,566,982 B2
(45) Date of Patent: May 20, 2003

(54) LEAD FRAME SET AND SAW FILTER USING THE SAME

(75) Inventors: Minoru Sakai, Tokyo (JP); Yasushi Yamamoto, Tokyo (JP)

(73) Assignee: NRS Technologies Inc., Hokkaido (JP)

( * ) Notice: Subject to any disclaimer, the term of this patent is extended or adjusted under 35 U.S.C. 154(b) by 0 days.

(21) Appl. No.: 09/938,596

(22) Filed: Aug. 27, 2001

(65) Prior Publication Data

US 2002/0024409 A1 Feb. 28, 2002

(30) Foreign Application Priority Data

Aug. 28, 2000 (JP) ........................................ 2000/257347

(51) Int. Cl.[7] .............................. H03H 9/64; H03H 9/05
(52) U.S. Cl. ..................... 333/193; 257/666; 257/692; 257/696; 310/313 R; 438/123
(58) Field of Search ................................. 333/193–196, 333/133; 310/313 R; 257/666, 672, 676, 690, 692, 696, 702; 438/123

(56) References Cited

U.S. PATENT DOCUMENTS

| | | | | |
|---|---|---|---|---|
| 4,711,700 A | * | 12/1987 | Cusack ...................... 156/651 |
| 5,072,283 A | * | 12/1991 | Bolger ......................... 357/72 |
| 5,448,451 A | * | 9/1995 | Takubo et al. .............. 361/749 |
| 5,760,526 A | * | 6/1998 | Anderson ............... 310/313 R |
| 5,767,566 A | * | 6/1998 | Suda ........................... 257/666 |
| 5,859,471 A | * | 1/1999 | Kuraishi et al. ............ 257/666 |
| 6,072,239 A | * | 6/2000 | Yoneda et al. .............. 257/730 |
| 6,087,713 A | * | 7/2000 | Haruta ....................... 257/666 |
| 6,265,761 B1 | * | 7/2001 | Ghai .......................... 257/666 |
| 6,376,903 B1 | * | 4/2002 | Kim ........................... 257/678 |

FOREIGN PATENT DOCUMENTS

| | | | | |
|---|---|---|---|---|
| JP | 1-312856 | * | 12/1989 | ........ 438/FOR 379 |
| JP | 2-78262 | * | 3/1990 | ................. 257/692 |
| JP | 5-63495 | | 3/1993 | |
| JP | 5-121492 | | 5/1993 | |
| JP | 10-270626 | | 10/1998 | |

* cited by examiner

*Primary Examiner*—Barbara Summons
(74) *Attorney, Agent, or Firm*—McGinn & Gibb, PLLC

(57) ABSTRACT

A lead frame set includes a plurality of lead frames disposed in parallel and each lead frame includes a plurality of leads. Each of the leads includes an inner lead, an intermediate portion, and an outer lead, the intermediate portions are embedded in a resin molding base, and connect the inner leads at a higher level to the outer leads at a lower level, and at least one of widths and pitches of the inner leads and the outer leads are different values.

20 Claims, 6 Drawing Sheets

LEAD FRAME SET AND SAW FILTER USING THE SAME

BACKGROUND OF THE INVENTION

This application claims benefit of Japanese Patent Application No. 2000-257347 filed on Aug. 28, 2000, the contents of which are incorporated by the reference. The present invention relates to a lead frame set and, more particularly, to elastic surface wave (SAW) filters used for portable telephone sets and the like and also lead frames used in such SAW filters.

Prior art SAW filters are disclosed as, for instance, "Elastic Surface Wave Devices" in Japanese Patent Laid-Open No. 5-63495. Also, prior art leads frames for such electronic components as IC (semiconductor integrated circuit) are disclosed, for instance, as "TAB Tape" in Japanese Patent Laid-Open No. 5-121492 and as "Semiconductor Device and Method of Manufacturing the Same" in Japanese Patent Laid-Open No. 10-270626.

FIG. 11 is a plan view showing an example of such prior art lead frames. FIG. 12 is a plan view showing an SAW filter using these lead frames. The lead frames are shown together with a resin molding 5 for securing them thereto. Each lead frame has an inner and an outer lead 1 and 2. The lead frames each having the inner and outer leads 1 and 2 are coupled together at a predetermined interval by a tie bar (or carrier) 3. In the prior art lead frame set as shown, the pitches or intervals A1 and A2 of the inner and outer leads 1 and 2 were the same (i.e., A1=A2), and also the widths A3 and A4 of the inner and outer leads A3 and A4 were the same (i.e., A3=A4).

With the same pitches A1 and A2 of the inner and outer leads 1 and 2 and also with the same widths A3 and A4 thereof, however, restrictions are imposed on the design of the inner and outer leads 1 and 2 of the SAW filter. These restrictions lead to a problem of reducing the scope of the leads (matching) with respect to PWB (i.e., printed wiring board) for connector (which the leads are mounted in.

SUMMARY OF THE INVENTION

An object of the present invention is to solve the above problem inherent in the prior art by the provision of lead frames, which is used for small-in-size, light-in-weight and highly integrated portable telephone terminals or the like and has high versatility of connection to the PWB, and also an SAW filter using such lead frames.

According to an aspect of the present invention, there is provided a lead frame set comprising a plurality of lead frames disposed in parallel and each having an inner lead and an outer lead, wherein: at least the widths or the pitches of the inner and outer leads are chosen to be different values.

According to another aspect of the present invention, there is provided a lead frame set comprising a plurality of lead frames disposed in parallel and each having an inner lead and an outer lead, wherein: at least the widths or the pitches of the inner and outer leads are chosen to be different values and the lead frames each have a transient portion intervening between the inner and outer leads and have the transient portion secured to a resin molding base.

The inner and outer leads are matched in position to the top and bottom surfaces, respectively, of a bottom portion of the resin molding base.

According to other aspect of the present invention, there is provided a lead frame set comprising a plurality of lead frames disposed in parallel and each having an inner lead and an outer lead, wherein: the pitch of the outer leads is chosen to be greater than that of the inner leads and the width of the outer leads is chosen to be greater than that of the inner leads.

According to further aspect of the present invention, there is provided a lead frame set comprising a plurality of lead frames disposed in parallel and each having an inner lead and an outer lead, wherein: the pitch of the outer leads is chosen to be less than that of the inner leads and the width of the outer leads is chosen to be the same as that of the inner leads.

According to still further aspect of the present invention, there is provided a lead frame set comprising a plurality of lead frames disposed in parallel and each having an inner lead and an outer lead, wherein: the pitch of the outer leads is chosen to be greater than that of the inner leads and the width of the outer leads is chosen to be less than the width of the inner leads.

According to other aspect of the present invention, there is provided a lead frame set comprising a plurality of lead frames disposed in parallel and each having an inner lead and an outer lead, wherein: the pitch of the outer leads is chosen to be less than that of the inner leads and also the width of the outer leads is chosen to be less than that of the inner leads.

According to still other aspect of the present invention, there is provided a lead frame set comprising a plurality of lead frames disposed in parallel and each having an inner lead and an outer lead, wherein: the pitch of the outer leads is chosen to be greater than that of the inner leads and the width of the outer leads is chosen to be less than that of the inner leads.

According to other aspect of the present invention, there is provided a lead frame set comprising a plurality of lead frames disposed in parallel and each having an inner lead and an outer lead, wherein: the pitch of the outer leads is chosen to be the same than that of the inner leads and the width of the outer leads is chosen to be less than that of the inner leads.

According to still aspect of the present invention, there is provided a lead frame set comprising a plurality of lead frames disposed in parallel and each having an inner lead and an outer lead, wherein: the pitch of the outer leads is chosen to be the same than that of the inner leads and the width of the outer leads is chosen to be greater than that of the inner leads.

According to further aspect of the present invention, there is provided an SAW filter comprising the lead frame set according to one of claims 1 and 4–10, and an SAW chip connected to the inner leads of the lead frames.

The lead frames each have a transient portion intervening between the inner and outer leads, the transient portion being secured to a resin molding base. The lead frames each have a transient portion intervening between the inner and outer leads, the transient portion being secured to a resin molding base, the bottom surface of the outer leads of the lead frames are made to be substantially flush with the bottom surface of the resin molding base, and the width and the pitch of the outer leads are matched to the wiring pattern of a connector board. The lead frames each have a transient portion intervening between the inner and outer leads, the transient portion being secured to a resin molding base and the SAW chip and a connector part are covered by a resin molding cap.

Other objects and features will be clarified from the following description with reference to attached drawings.

PREFERRED EMBODIMENTS OF THE INVENTION

Preferred embodiments of the present invention will now be described with reference to the drawings.

Figure 1:
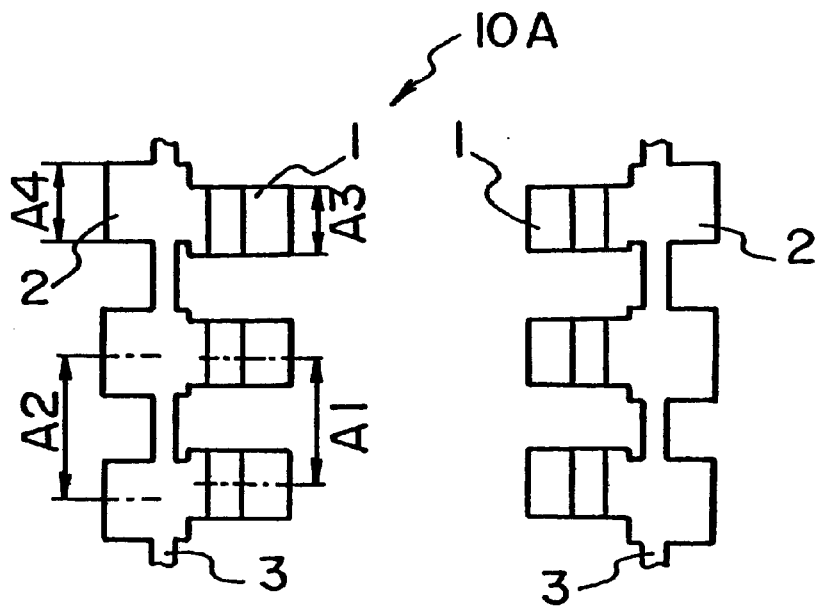
FIG. 1 is a plan view showing the construction of a first embodiment of the lead frame set (for SAW) according to the present invention.
Figure 11:
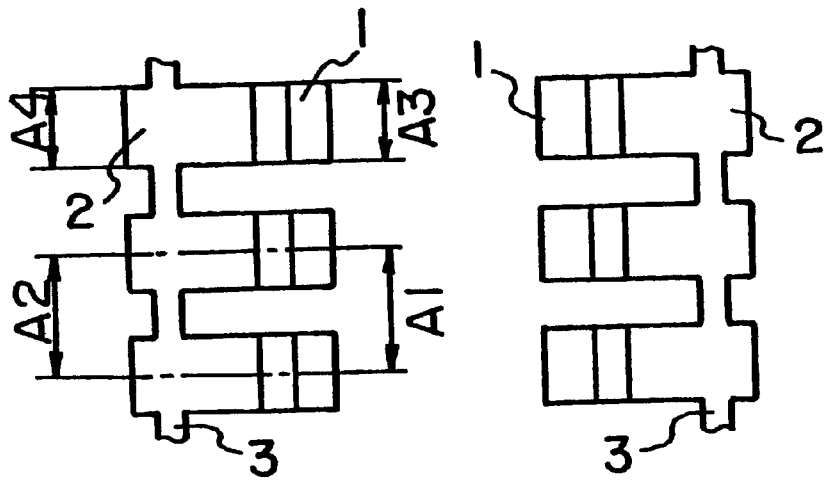
FIG. 11 is a plan view showing an example of such prior art lead frames.
Figure 12:
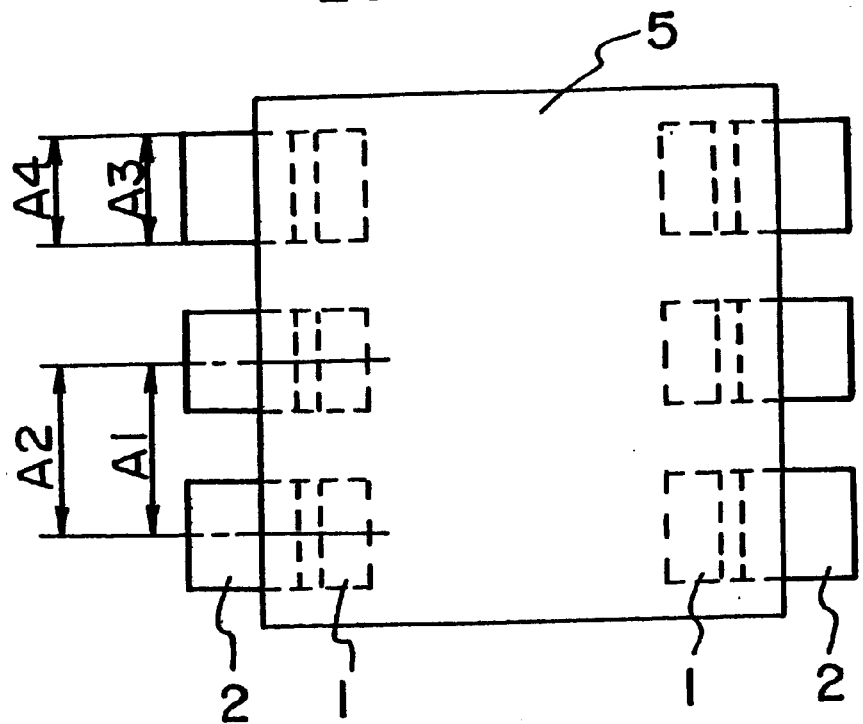
FIG. 12 is a plan view showing an SAW filter using these lead frames.

FIG. 1 is a plan view showing the construction of a first embodiment of the lead frame set (for SAW) according to the present invention. In the Figure, the components corresponding to those in the prior art shown in FIGS. 11 and 12 are designated by like reference numerals. The embodiment of the lead frame set 10A shown in FIG. 1 according to the present invention, comprises a plurality of lead frames each having an inner and an outer leads 1 and 2. The lead frames are coupled together in a juxtaposed or parallel fashion by a tie bar 3. In FIG. 1, denoted by A1 is the pitch of the inner leads 1, denoted by A2 is the pitch of the outer leads 2, denoted by A3 is the width of the inner leads 1, and denoted by A4 is the width of the outer leads 2.

A specific example of the lead frame set 10A according to the present invention will now be described. The lead frame set 10A is made of a copper (Cu) alloy and has a plating surface layer having a thickness of 0.01 mm. The tie bars coupling together the juxtaposed outer lead 2 has a width of 0.2 mm and a thickness of 0.125 mm. The width A4 of the outer leads 2 coupled together by the tie bar 3 is chosen to be 0.6 mm. The width A3 and the thickness of the inner leads 1 are chosen to be 0.4 and 0.125 mm, respectively.

Figure 2:
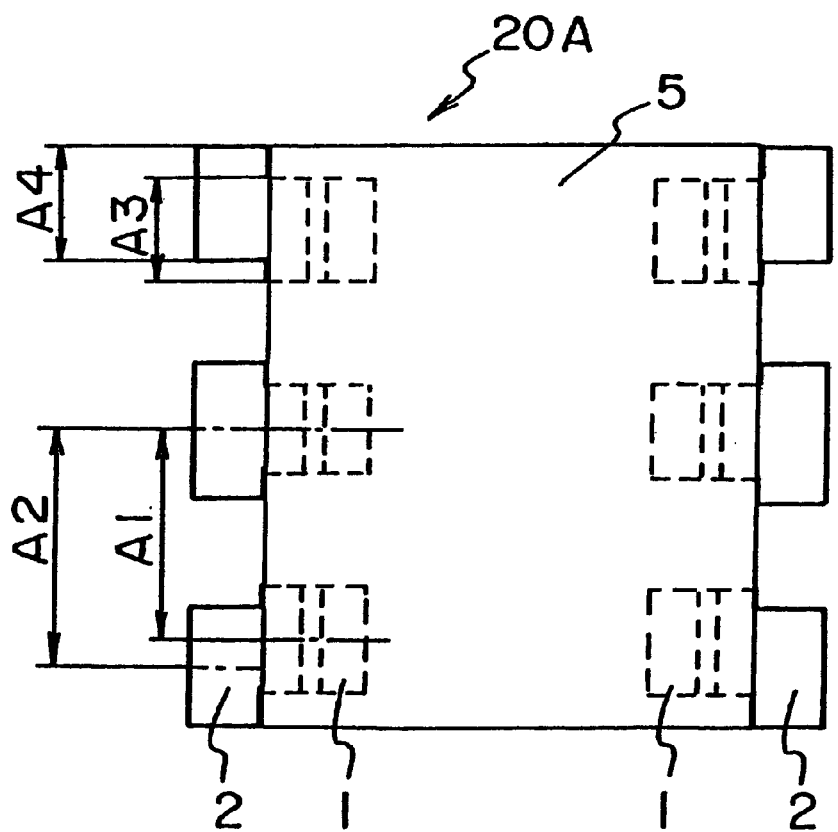
FIG. 2 is a schematic plan view showing an SAW filter 20A using the lead frame set 10A shown in FIG. 1.

As is seen from the comparison of FIG. 1 and FIG. 11 (and FIG. 12), the embodiment of the lead frame set 10A shown in FIG. 1, compared to the prior art lead frame set shown in FIG. 11, features contriving of its matching to PWB foot patterns by increasing the width A4 of the outer leads 2 and also choosing the pitch A2 of the outer leads 2 to be greater than the pitch A1 of the inner leads FIG. 2 is a schematic plan view showing an SAW filter 20A using the lead frame set 10A shown in FIG. 1. As will be described later, the lead frame set 10A is secured to a resin molding comprising a resin molding base and a resin molding cap (only resin molding cap 5 being shown in FIG. 2). The outer leads 2 of the lead frame set 10A are dimension converted in width and pitch from the inner leads 1 on the outer surface of resin molding base 4 to be described later. When assembling the SAW filter 20A, the tie bar 3 of the lead frame set 10A is cut off.

Figure 3:
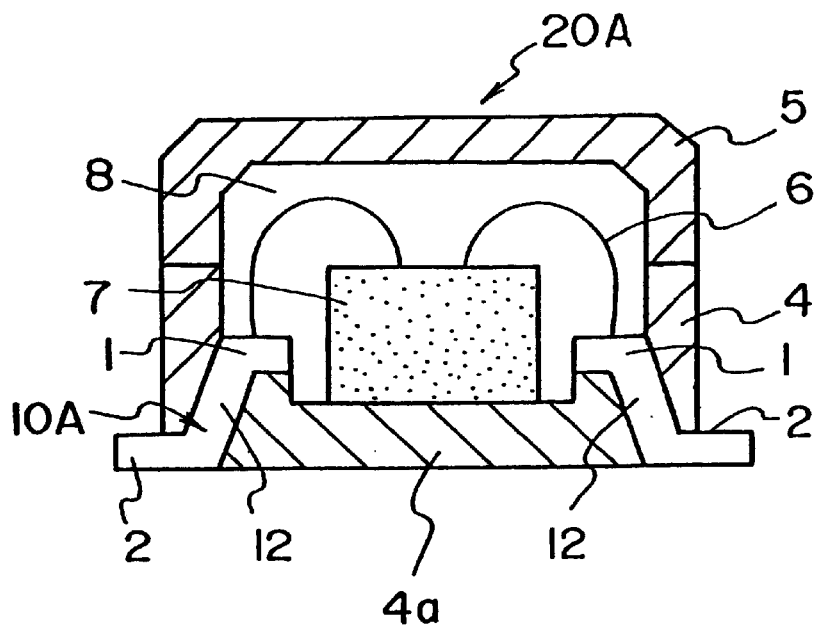
FIG. 3 is a sectional view showing the SAW filter 20A using the lead frame set 10A shown in FIG. 1 according to the present invention.

FIG. 3 is a sectional view showing the SAW filter 20A using the lead frame set 10A shown in FIG. 1 according to the present invention. As shown, the SAW filter 20A comprises the lead frame set 10A having the inner and outer leads 1 and 2 shown in FIG. 1, the resin molding base 4, the resin molding cap 5, thin metal wires 6 and an SAW chip 7. As hollow space 8 is defined between the resin molding base 4 and cap 5, in which space the SAW chip 7 and thin wires 6 are disposed or accommodated. The thin wires may be gold wires, and connect electrodes of the SAW chip 7 and the corresponding inner leads 1 of the lead frames 10A.

As is seen from the sectional view of FIG. 3, the lead frame set 10A is bent such that the inner leads 1 and outer leads 2 of each leads frame 10 are stepped in level by a transient or intermediate portion along side walls of the resin molding base 4. Specifically, the inner leads 1 are made to be flush with the top surface of a bottom portion 4a of the resin molding base 4, and the outer leads 2 are made to be flush with the bottom surface of the bottom portion 4a. This structure permits optimum bonding of the inner leads 1 of the lead frame set 10A to the corresponding electrodes of the SAW chip 7 by the thin metal wires 6 and also soldering (for instance, reflow soldering) of the outer leads 2 to the PWB (printed wiring board) with the SAW filter 20A matched to the wiring pattern (not shown) of the PWB. Thus, it is possible to match the SAW chip 7 of SAW filter 20 and the wiring pattern of PWB.

Figure 4:
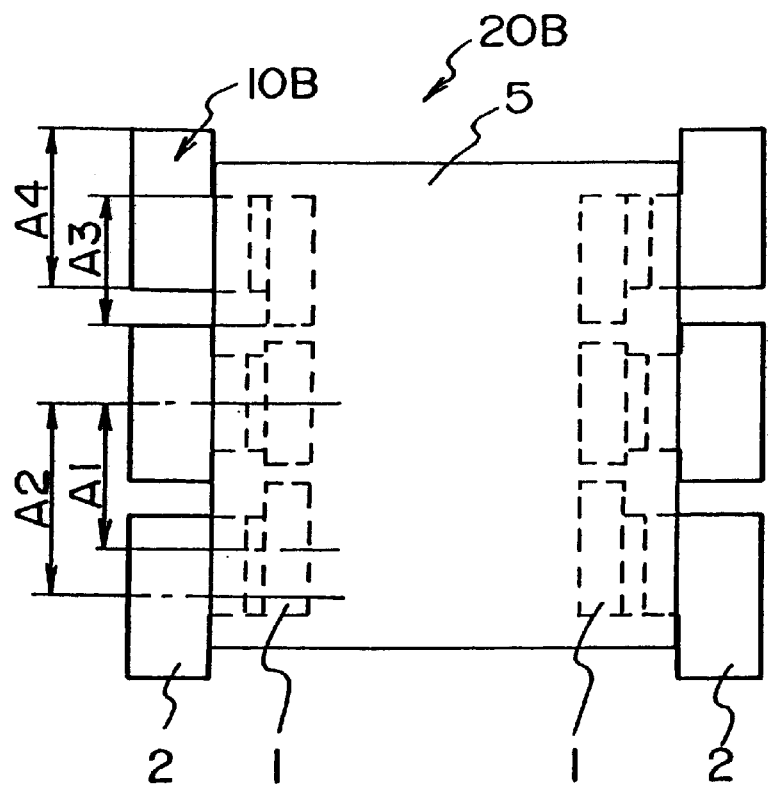
FIG. 4 is a plan view showing a second embodiment of the SAW filter 20B using a lead frame set 10B according to the present invention.

FIG. 4 is a plan view showing a second embodiment of the SAW filter 20B using a lead frame set 10B according to the present invention. This second embodiment features that the pitch A2 of the outer leads 2 of the lead frame set 10B is chosen to be greater than the pitch A1 of the inner leads 1 and also that the width A4 of the outer leads 2 is chosen to be greater than the width A3 of the inner leads 1.

Figure 5:
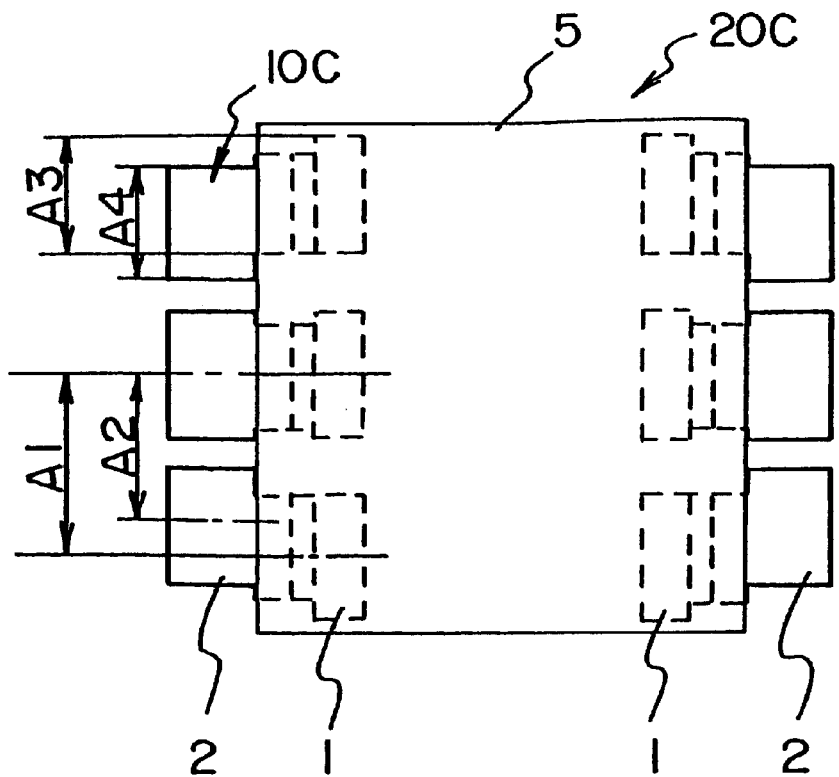
FIG. 5 is a plan view showing a third embodiment of the SAW filter 20C using a lead frame 10C according to the present invention.

FIG. 5 is a plan view showing a third embodiment of the SAW filter 20C using a lead frame 10C according to the present invention. This third embodiment features that the pitch A2 of the outer leads 2 of the lead frame set 10C is chosen to be less than the pitch Al of the inner leads 1 and also that the width A4 of the outer leads 2 is chosen to be the same as the width A3 of the inner leads 1.

Figure 6:
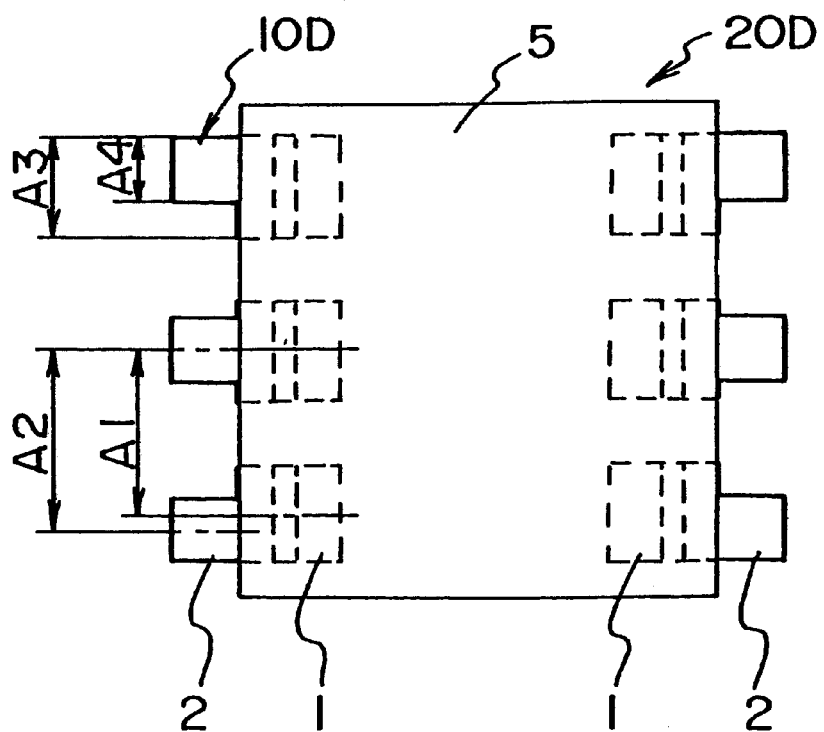
FIG. 6 is a plan view showing a fourth embodiment of the SAW filter 20D using the lead frame set 10D according to the present invention.

FIG. 6 is a plan view showing a fourth embodiment of the SAW filter 20D using the lead frame set 10D according to the present invention. In this fourth embodiment, the pitch A2 of the outer leads 2 of the lead frame set 10D is chosen to be greater than the pitch A1 of the inner leads 1 and also that width A4 of the outer leads 2 is chosen to be less than the width A3 of the inner leads 1.

Figure 7:
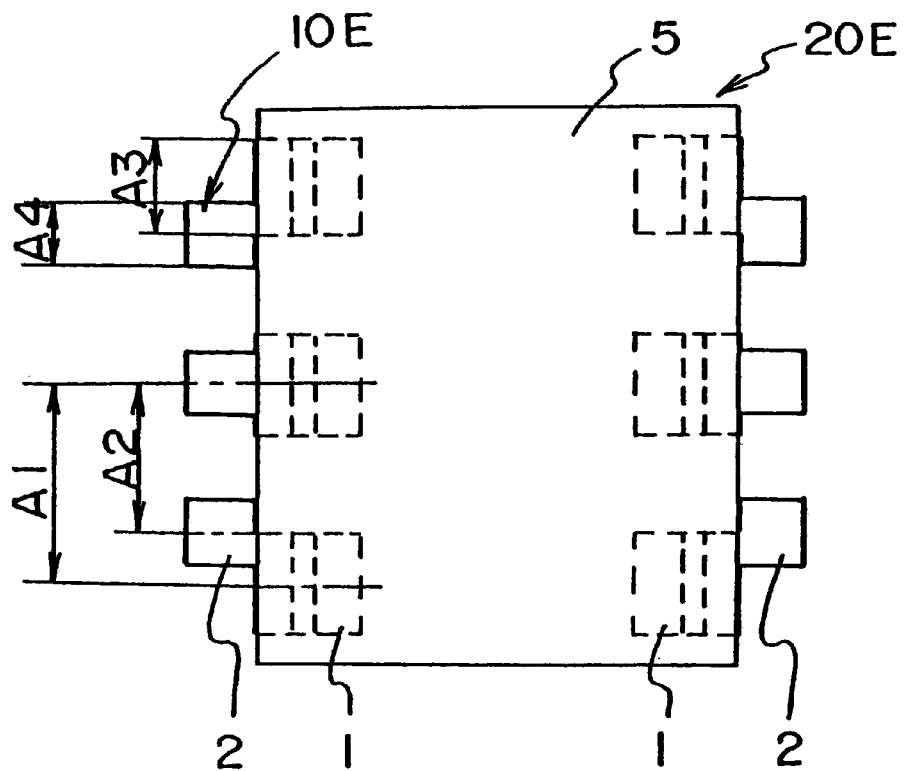
FIG. 7 is a plan view showing a fifth embodiment of the SAW filter 20E using a lead frame set 10E according to the present invention.

FIG. 7 is a plan view showing a fifth embodiment of the SAW filter 20E using a lead frame set 10E according to the present invention. In this fifth embodiment, the pitch A2 of the outer leads 2 of the lead frame set 10E is chosen to be less than the pitch A1 of the inner leads 1 and also that the width A4 of the outer leads 2 is chosen to be less than the width A3 of the inner leads 1.

Figure 8:
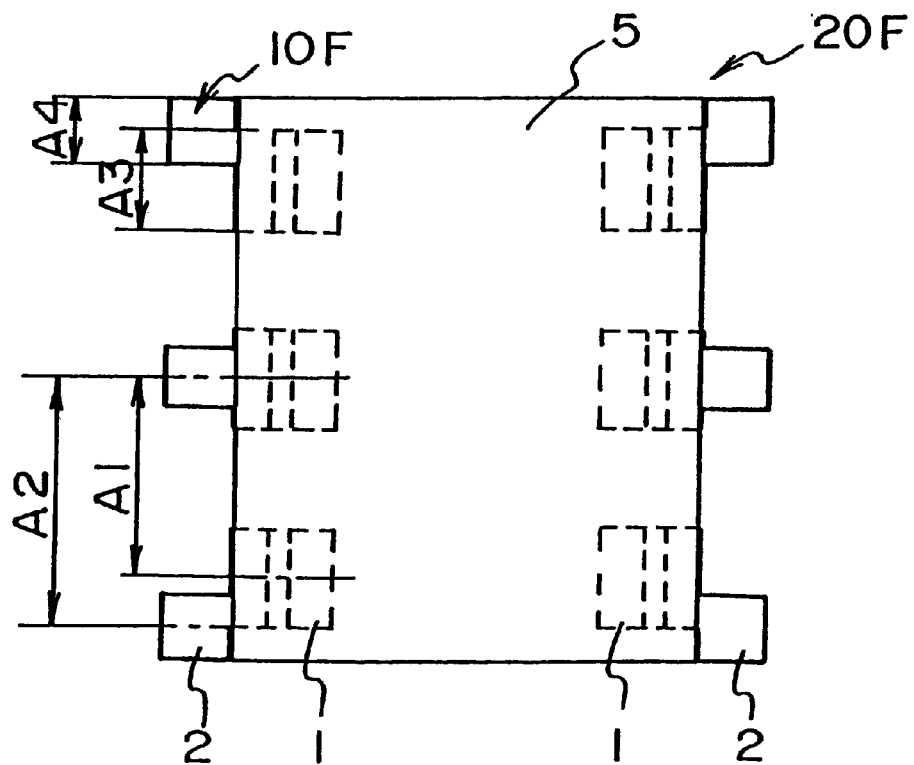
FIG. 8 is a plan view showing a sixth embodiment of the SAW filter 20F using a lead frame set 10F according to the present invention.

FIG. 8 is a plan view showing a sixth embodiment of the SAW filter 20F using a lead frame set 10F according to the present invention. In this sixth embodiment, the pitch A2 of the outer leads 2 of the lead frame set 10F is chosen to be greater than the pitch A1 of the inner leads 1 and also that the width A4 of the outer leads 2 is chosen to be less than the width A3 of the inner leads 1.

Figure 9:
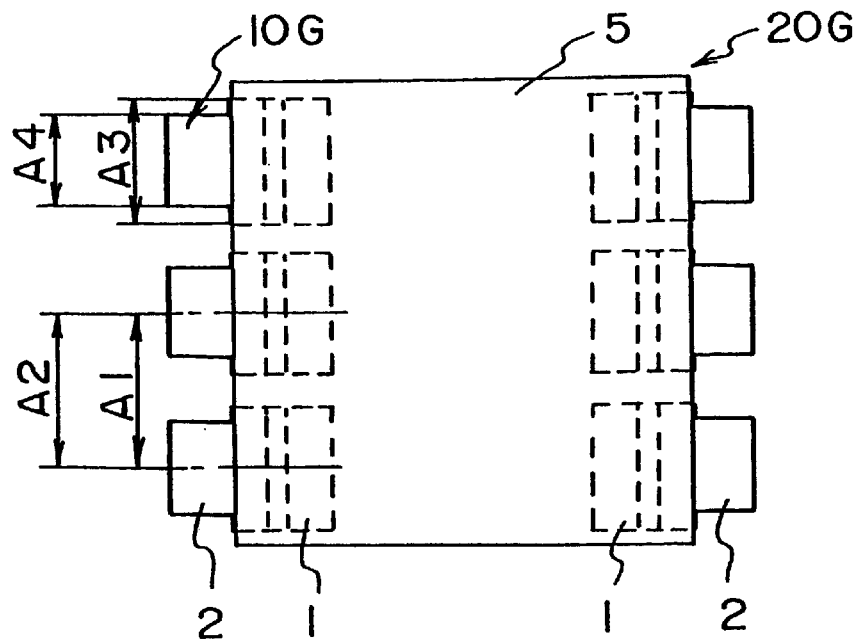
FIG. 9 is a plan view showing a seventh embodiment of the SAW filter 20G using a lead frame set 10G according to the present invention.

FIG. 9 is a plan view showing a seventh embodiment of the SAW filter 20G using a lead frame set 10G according to the present invention. In this seventh embodiment, the pitch A2 of the outer leads 2 of the lead frame set 10G is chosen to be the same as the pitch A1 of the inner leads 1 and also the width A4 the outer leads 2 is chosen to be less than the width A3 of the inner leads 1.

Figure 10:
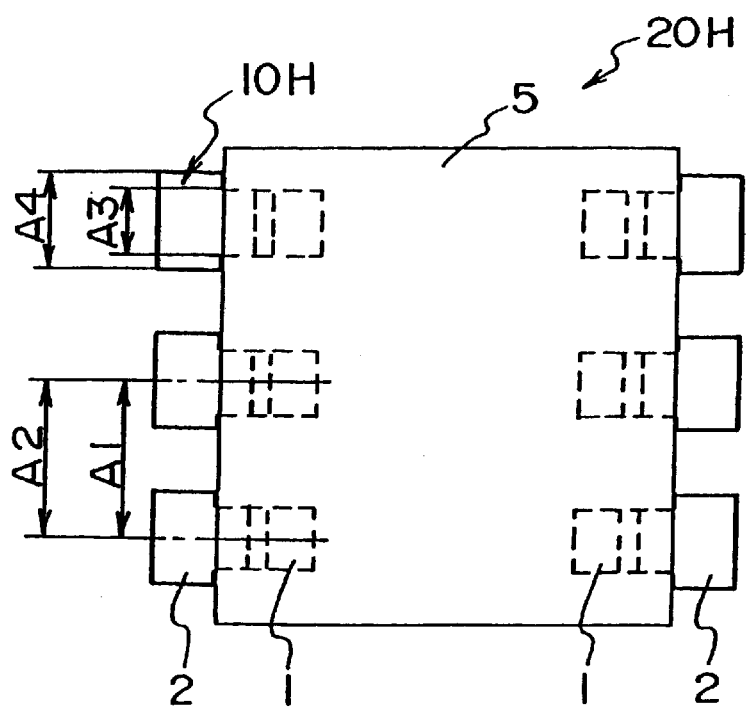
FIG. 10 is a plan view showing an eighth embodiment of the SAW filter 20H using a lead frame set 10H according to the present invention.

Finally, FIG. 10 is a plan view showing an eighth embodiment of the SAW filter 20H using a lead frame set 10H according to the present invention. In this eighth embodiment, the pitch A2 of the outer leads 2 of the lead frame set 10H is chosen to be the same as the pitch A1 of the inner leads 1 and also that the width A4 of the outer leads 2 is chosen to be greater than the width A3 of the inner leads 1.

The lead frame set and SWA filter using the same according to various embodiments of the present invention have been described in the foregoing. However, changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting. For example, according to the present invention it is of course possible to freely design not only the width and pitch of the inner and outer leads 1 and 2 but also the thickness and shape of these leads 1 and 2.

As has been understood from the foregoing, according to the present invention the following pronounced practical advantages are obtainable. Since the pitches A1 and A2 and the widths A3 and A4 of the inner and outer leads 1 and 2 of the lead frame set can be freely chosen, it is possible to match the lead frame set to the foot (or wiring) pattern of PWB. In addition, it is possible to easily change components during manufacture, which contributes to the performance improvement and cost reduction of portable terminals or the like using the saw filter using the lead frame set according to the present invention.

Furthermore, since the present invention provides for high freedom of designing the outer leads 2, it is possible to set leads which are matched to a PWB circuit evade detachment of components due to falling or vibrations of the portable terminal or the like using the circuit.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A lead frame set comprising a plurality of lead frames disposed in parallel and each lead frame including a plurality of leads, wherein:

each of the plurality of leads includes an inner lead, an intermediate portion, and an outer lead, the intermediate portions are embedded in a resin molding base, and connect the inner leads at a higher level to the outer leads at a lower level, and at least one of widths and pitches of the inner leads and the outer leads are different values.

2. The lead frame set according to claim 1, wherein the inner leads and the outer leads are matched in position to top and bottom surfaces, respectively, of a bottom portion of the resin molding base.

3. An SAW filter comprising the lead frame set according to claim 1, and an SAW chip connected to the inner leads of the lead frames.

4. The SAW filter according to claim 3, wherein the bottom surface of the outer leads of the lead frames are substantially flush with the bottom surface of the resin molding base, and a width and a pitch of the outer leads are matched to a wiring pattern of a connector board.

5. The SAW filter according to claim 3, wherein the SAW chip and a connector part are covered by a resin molding cap.

6. A lead frame set comprising a plurality of lead frames disposed in parallel and each having an inner lead and an outer lead, wherein:

a pitch of the outer leads is greater than that of the inner leads and a width of the outer leads is less than the width of the inner leads.

7. An SAW filter comprising the lead frame set according to claim 6, and an SAW chip connected to the inner leads of the lead frames.

8. A lead frame set comprising a plurality of lead frames disposed in parallel and each having an inner lead and an outer lead, wherein:

a pitch of the outer leads is greater than that of the inner leads and a width of the outer leads is less than that of the inner leads, and those outer leads, which are disposed at corners of a resin molding base, have an outer edge that is flush to an edge formed by a width of the resin molding base.

9. An SAW filter comprising the lead frame set according to claim 8, and an SAW chip connected to the inner leads of the lead frames.

10. A lead frame set comprising a plurality of lead frames disposed in parallel and each lead frame including a plurality of leads, wherein:

each of the plurality of leads includes an inner lead, an intermediate portion, and an outer lead, the intermediate portions are embedded in a resin molding base, and connect the inner leads at a higher level to the outer leads at a lower level, and a pitch of the outer leads is the same than that of the inner leads and a width of the outer leads is greater than that of the inner leads.

11. An SAW filter comprising the lead frame set according to claim 10, and an SAW chip connected to the inner leads of the lead frames.

12. A lead frame set comprising a plurality of lead frames disposed in parallel and each having an inner lead and an outer lead, wherein:

a pitch of the outer leads is less than that of the inner leads and a width of the outer leads is the same as that of the inner leads.

13. An SAW filter comprising the lead frame set according to claim 12, and an SAW chip connected to the inner leads of the lead frames.

14. A lead frame set comprising a plurality of lead frames disposed in parallel and each lead frame including a plurality of leads, wherein:
- each of the plurality of leads includes an inner lead, an intermediate portion, and an outer lead,
- the intermediate portions are embedded in a resin molding base, and connect the inner leads at a higher level to the outer leads at a lower level, and
- a pitch of the outer leads is greater than that of the inner leads and a width of the outer leads is greater than that of the inner leads.

15. An SAW filter comprising the lead frame set according to claim 14, and an SAW chip connected to the inner leads of the lead frames.

16. A lead frame set comprising a plurality of lead frames disposed in parallel and each lead frame including a plurality of leads, wherein:
- each of the plurality of leads includes an inner lead, an intermediate portion, and an outer lead,
- the intermediate portions are embedded in a resin molding base, and connect the inner leads at a higher level to the outer leads at a lower level,
- a pitch of the outer leads is greater than that of the inner leads and a width of the outer leads greater than that of the inner leads, and
- those outer leads, which are disposed at corners of a resin molding base, have an outer edge that is flush to an edge formed by a width of the resin molding base.

17. A lead frame set comprising a plurality of lead frames disposed in parallel and each lead frame including a plurality of leads, wherein:
- each of the plurality of leads includes an inner lead, an intermediate portion, and an outer lead,
- the intermediate portions are embedded in a resin molding base, and connect the inner leads at a higher level to the outer leads at a lower level, and
- a pitch of the outer leads is less than that of the inner leads and a width of the outer leads is less than that of the inner leads.

18. An SAW filter comprising the lead frame set according to claim 17, and an SAW chip connected to the inner leads of the lead frames.

19. A lead frame set comprising a plurality of lead frames disposed in parallel and each lead frame including a plurality of leads, wherein:
- each of the plurality of leads includes an inner lead, an intermediate portion, and an outer lead,
- the intermediate portions are embedded in a resin molding base, and connect the inner leads at a higher level to the outer leads at a lower level, and
- a pitch of the outer leads is the same than that of the inner leads and a width of the outer leads is less than that of the inner leads.

20. An SAW filter comprising the lead frame set according to claim 19, and an SAW chip connected to the inner leads of the lead frames.

* * * * *